(12) United States Patent
Yiu et al.

(10) Patent No.: US 9,812,413 B2
(45) Date of Patent: Nov. 7, 2017

(54) CHIP MODULE AND METHOD FOR FORMING THE SAME

(71) Applicant: XINTEC INC., Taoyuan (TW)

(72) Inventors: Ho-Yin Yiu, KLN (HK); Ying-Nan Wen, Hsinchu (TW); Chien-Hung Liu, New Taipei (TW)

(73) Assignee: XINTEC INC., Taoyuan (TW)

( * ) Notice: Subject to any disclaimer, the term of this patent is extended or adjusted under 35 U.S.C. 154(b) by 121 days.

(21) Appl. No.: 14/994,537

(22) Filed: Jan. 13, 2016

(65) Prior Publication Data

US 2016/0211233 A1    Jul. 21, 2016

Related U.S. Application Data

(60) Provisional application No. 62/106,047, filed on Jan. 21, 2015.

(51) Int. Cl.
*H01L 23/00* (2006.01)
*H01L 23/31* (2006.01)
*H01L 29/06* (2006.01)

(52) U.S. Cl.
CPC .......... *H01L 24/02* (2013.01); *H01L 23/3114* (2013.01); *H01L 23/3135* (2013.01); *H01L 24/94* (2013.01); *H01L 24/03* (2013.01); *H01L 24/05* (2013.01); *H01L 24/13* (2013.01); *H01L 24/81* (2013.01); *H01L 29/0657* (2013.01); *H01L 2224/024* (2013.01); *H01L 2224/0235* (2013.01); *H01L 2224/0239* (2013.01); *H01L 2224/02311* (2013.01); *H01L 2224/02313* (2013.01); *H01L 2224/02331* (2013.01); *H01L 2224/02371* (2013.01); *H01L 2224/02381* (2013.01); *H01L 2224/03462* (2013.01);
(Continued)

(58) Field of Classification Search
CPC . H01L 24/02; H01L 23/3114; H01L 23/3135; H01L 24/94; H01L 2224/05548; H01L 2224/05569; H01L 2224/81192; H01L 2924/15153
See application file for complete search history.

(56) References Cited

U.S. PATENT DOCUMENTS 9,209,124 B2 * 12/2015 Huang ............... H01L 23/49838
2013/0285263 A1 * 10/2013 Arnold .................... H01L 24/11
257/780

(Continued)

FOREIGN PATENT DOCUMENTS

CN     204045565     12/2014
TW     201432880     8/2014

*Primary Examiner* — Daniel Luke
*Assistant Examiner* — Khatib Rahman
(74) *Attorney, Agent, or Firm* — Liu & Liu

(57) ABSTRACT

A chip module is provided. The chip module includes a chip having an upper surface, a lower surface and a sidewall. The chip includes a signal pad region adjacent to the upper surface. A recess extends from the upper surface toward the lower surface along the sidewall of the chip. A redistribution layer is electrically connected to the signal pad region and extends into the recess. A circuit board is located between the upper surface and the lower surface and extends into the recess. A conducting structure is located in the recess and electrically connects the circuit board to the redistribution layer. A method for forming the chip module is also provided.

24 Claims, 10 Drawing Sheets

(52) U.S. Cl.
CPC ............ *H01L 2224/03464* (2013.01); *H01L 2224/0401* (2013.01); *H01L 2224/05548* (2013.01); *H01L 2224/05569* (2013.01); *H01L 2224/131* (2013.01); *H01L 2224/13024* (2013.01); *H01L 2224/13111* (2013.01); *H01L 2224/13116* (2013.01); *H01L 2224/13147* (2013.01); *H01L 2224/16227* (2013.01); *H01L 2224/32225* (2013.01); *H01L 2224/73204* (2013.01); *H01L 2224/81192* (2013.01); *H01L 2224/81815* (2013.01); *H01L 2224/94* (2013.01); *H01L 2924/00015* (2013.01); *H01L 2924/0549* (2013.01); *H01L 2924/10156* (2013.01); *H01L 2924/15153* (2013.01)

(56) References Cited

U.S. PATENT DOCUMENTS

2014/0286605 A1* 9/2014 Lee .................... G02B 6/12
  385/14
2014/0332908 A1* 11/2014 Ho .................... H01L 21/76877
  257/414

* cited by examiner

CHIP MODULE AND METHOD FOR FORMING THE SAME

CROSS REFERENCE TO RELATED APPLICATIONS

This application claims priority of U.S. Provisional Application No. 62/106,047, filed Jan. 21, 2015, the entirety of which is incorporated by reference herein.

BACKGROUND OF THE INVENTION

Field of the Invention

The invention relates to chip package technology, and in particular to a chip module and methods for forming the same.

Description of the Related Art

The chip packaging process is an important step in the fabrication of electronic products. Chip packages not only protect the chips therein from outer environmental contaminants, but they also provide electrical connection paths between the electronic elements inside and those outside of the chip packages.

A conventional chip module or package having sensing functions is formed by disposing a chip on a printed circuit board. Wires are bonded from a contact pad region on an upper surface of the chip to the printed circuit board. Afterwards, the chip and the wires are covered by an encapsulating layer.

However, the thickness of the encapsulating layer cannot be reduced due to the height of the wires protruding from the upper surface of the chip. In order to prevent the sensitivity of the sensing region of the chip from being affected by the thick encapsulating layer, the side height of the periphery of the packaged chip module is higher than the height of the sensing region in the center of the packaged chip module. As a result, a flat surface cannot be formed. Moreover, since the wires are adjacent to the edges of the chip, they easily contact the chip edges during the bonding process which may result in a short circuit or a broken circuit, thereby reducing the yield.

Thus, there exists a need in the art for development of a chip module and methods for forming the same capable of mitigating or eliminating the aforementioned problems. As a result, a chip module having a flat contacting surface can be provided and the sensitivity of the chip module can be improved. Also, a more simplified and faster chip module packaging process can be provided.

BRIEF SUMMARY OF THE INVENTION

An embodiment of the invention provides a chip module. The chip module comprises a chip having an upper surface, a lower surface and a sidewall. The chip comprises a signal pad region adjacent to the upper surface. The chip module also comprises a recess extending from the upper surface toward the lower surface along the sidewall of the chip. The chip module further comprises a redistribution layer electrically connected to the signal pad region and extending into the recess. In addition, the chip module comprises a circuit board between the upper surface and the lower surface and extending into the recess. The chip module also comprises a conducting structure in the recess and electrically connecting the circuit board to the redistribution layer.

An embodiment of the invention provides a method for forming a chip module. The method comprises providing a chip having an upper surface, a lower surface and a sidewall. The chip comprises a signal pad region adjacent to the upper surface. A recess extends from the upper surface toward the lower surface along the sidewall. A redistribution layer is electrically connected to the signal pad region and extends into the recess. The method also comprises disposing a circuit board between the upper surface and the lower surface. The circuit board extends into the recess. The method further comprises forming a conducting structure in the recess to electrically connect the circuit board to the redistribution layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits or to form a system-in-package (SIP).

Figure 1A:
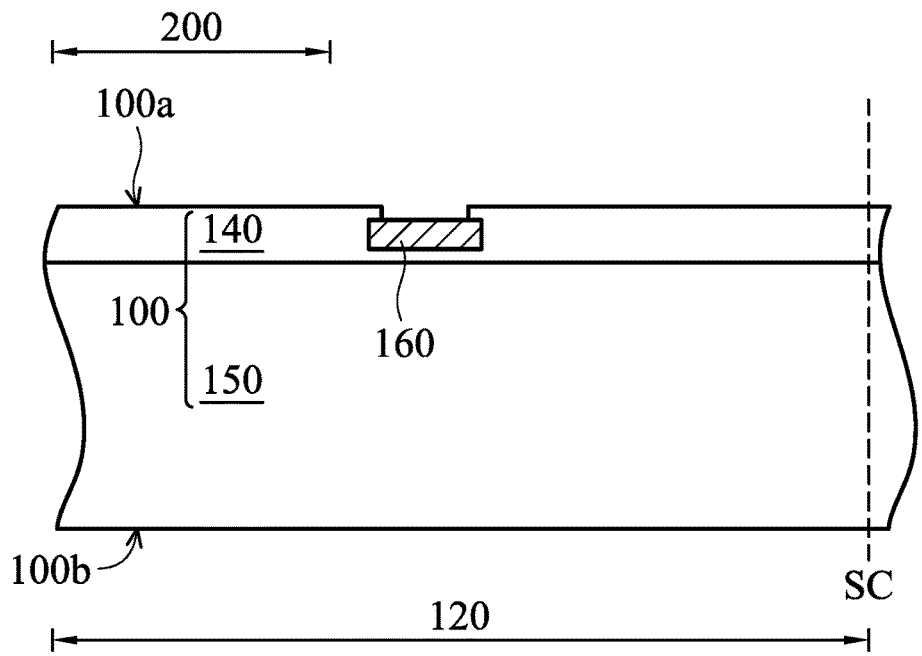
FIGS. 1A to 1H are cross-sectional views of an exemplary embodiment of a method for forming a chip module according to the invention.
Figure 1B:
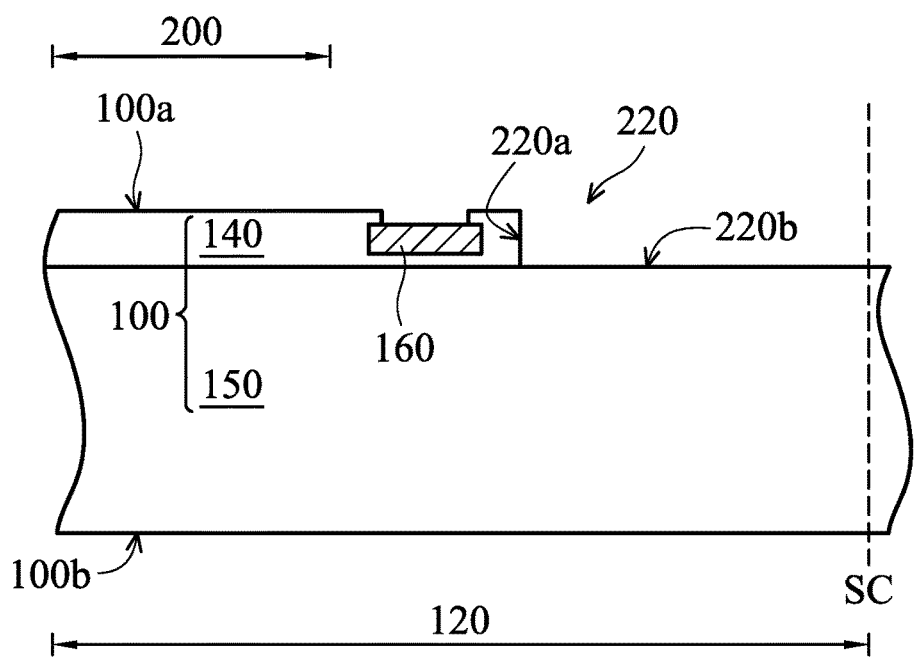
Figure 1C:
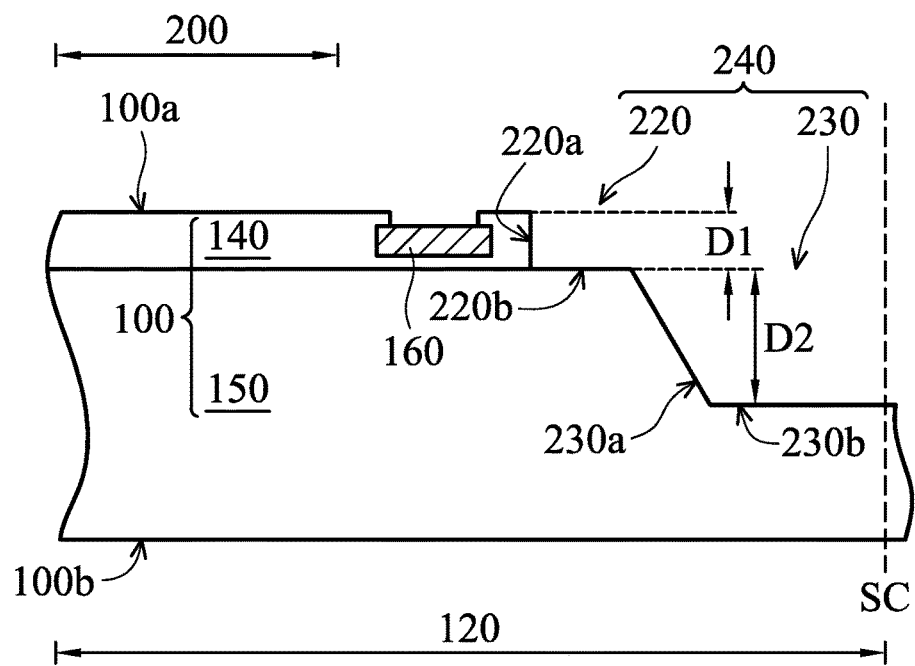
Figure 1D:
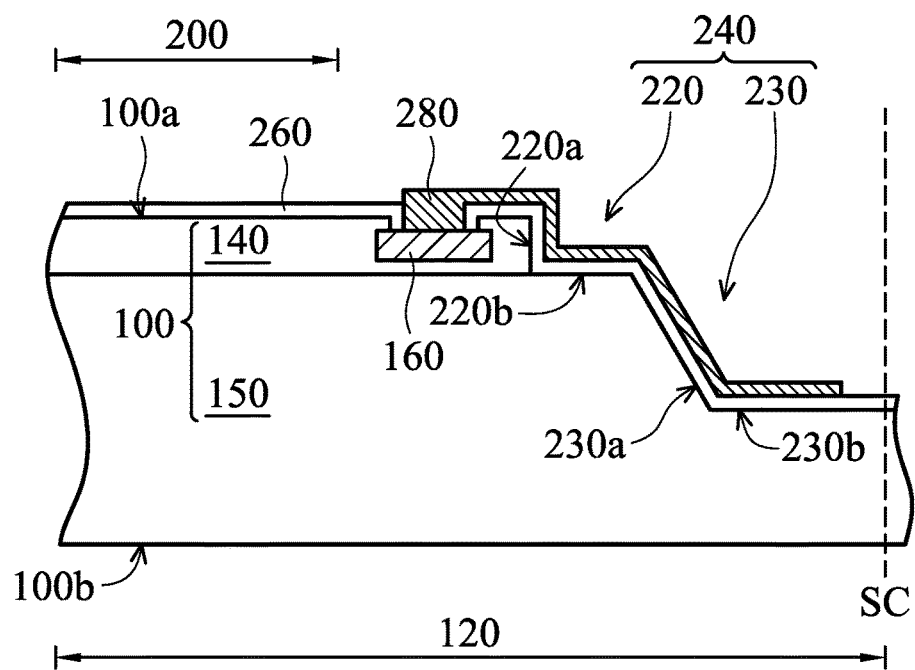
Figure 1E:
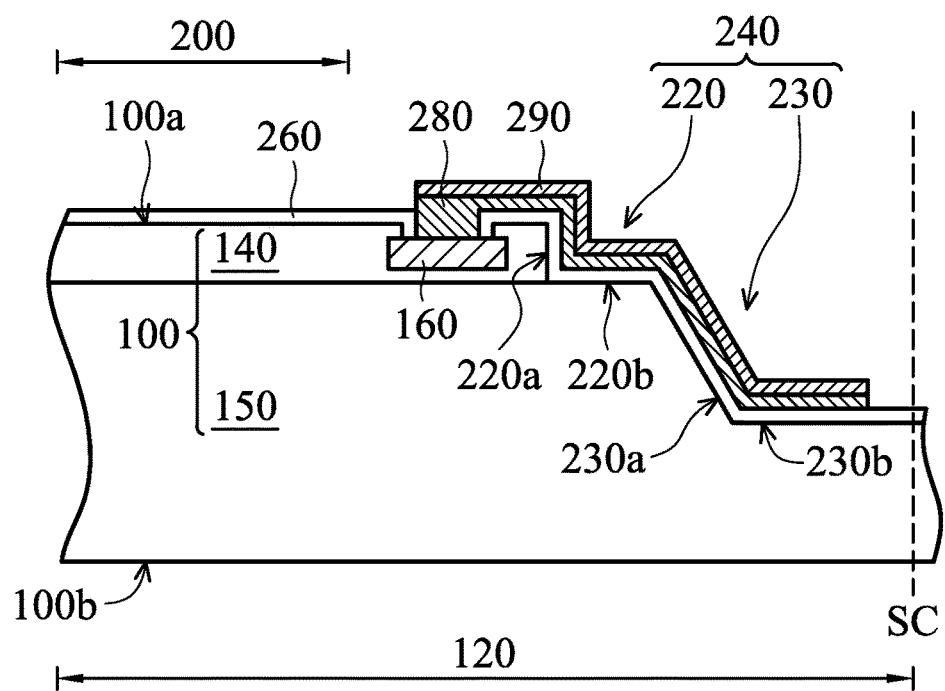
Figure 1F:
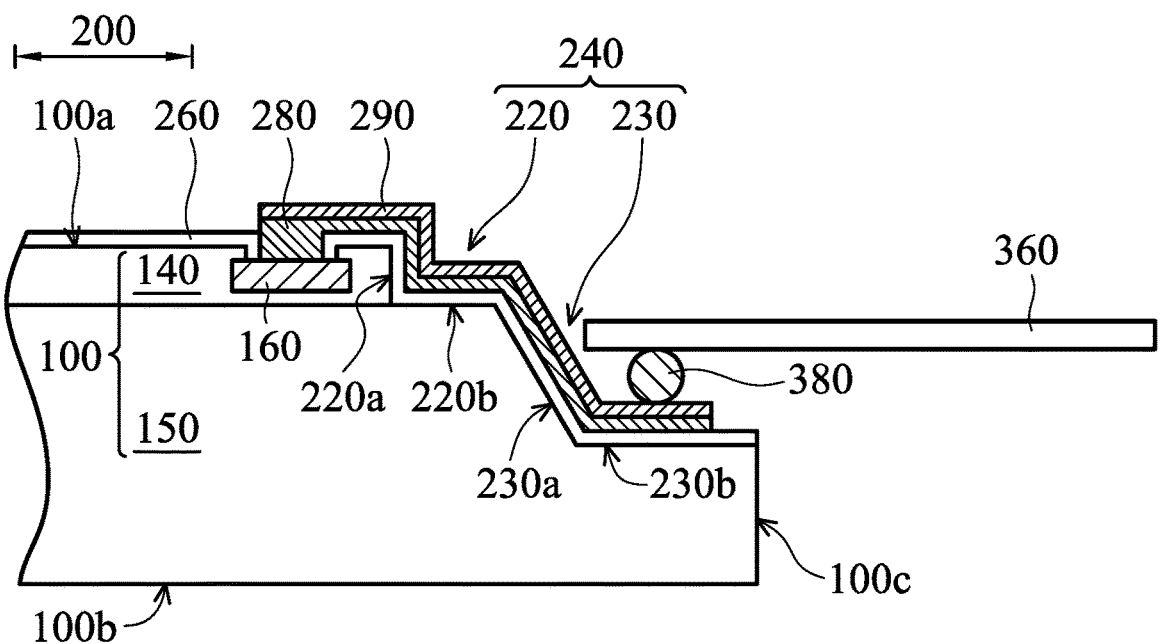
Figure 1G:
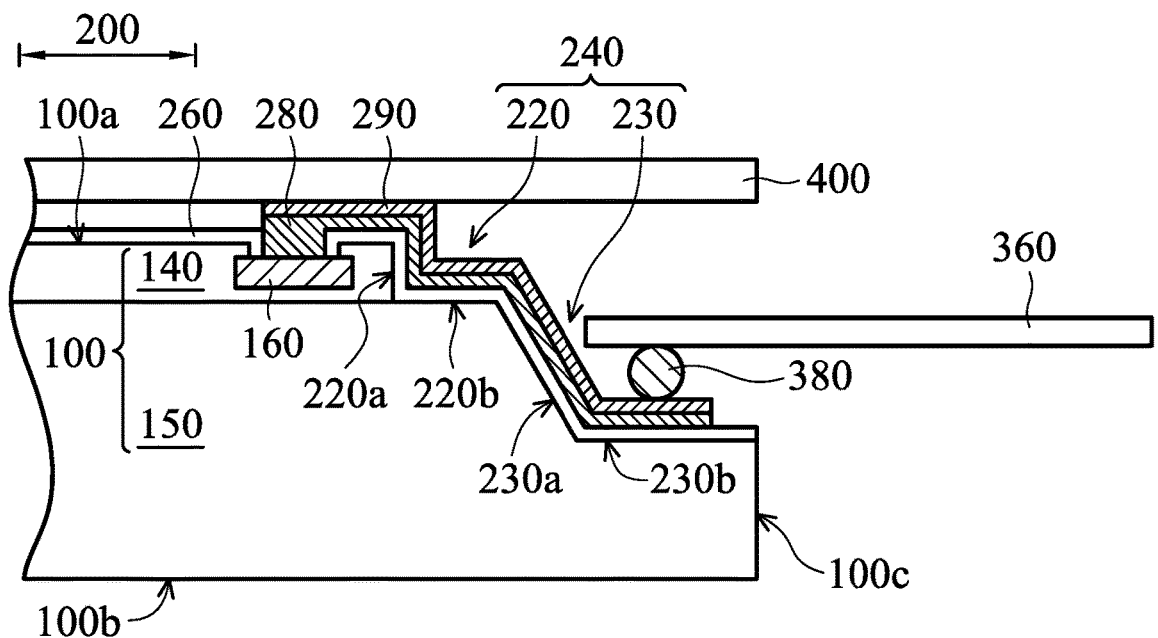
Figure 1H:
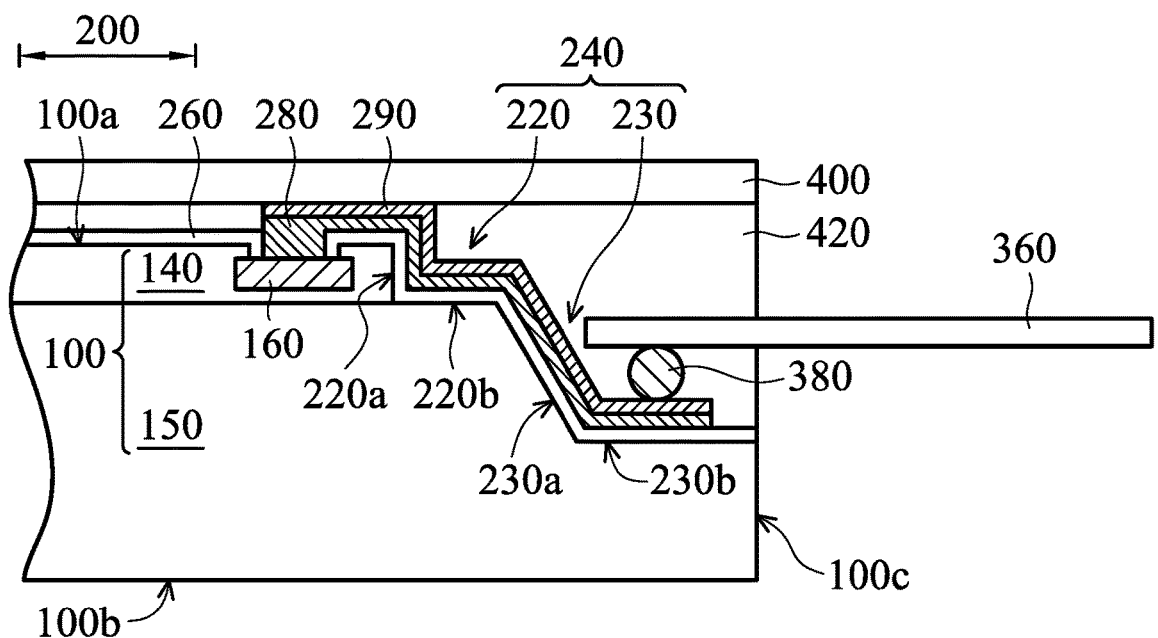
Figure 3:
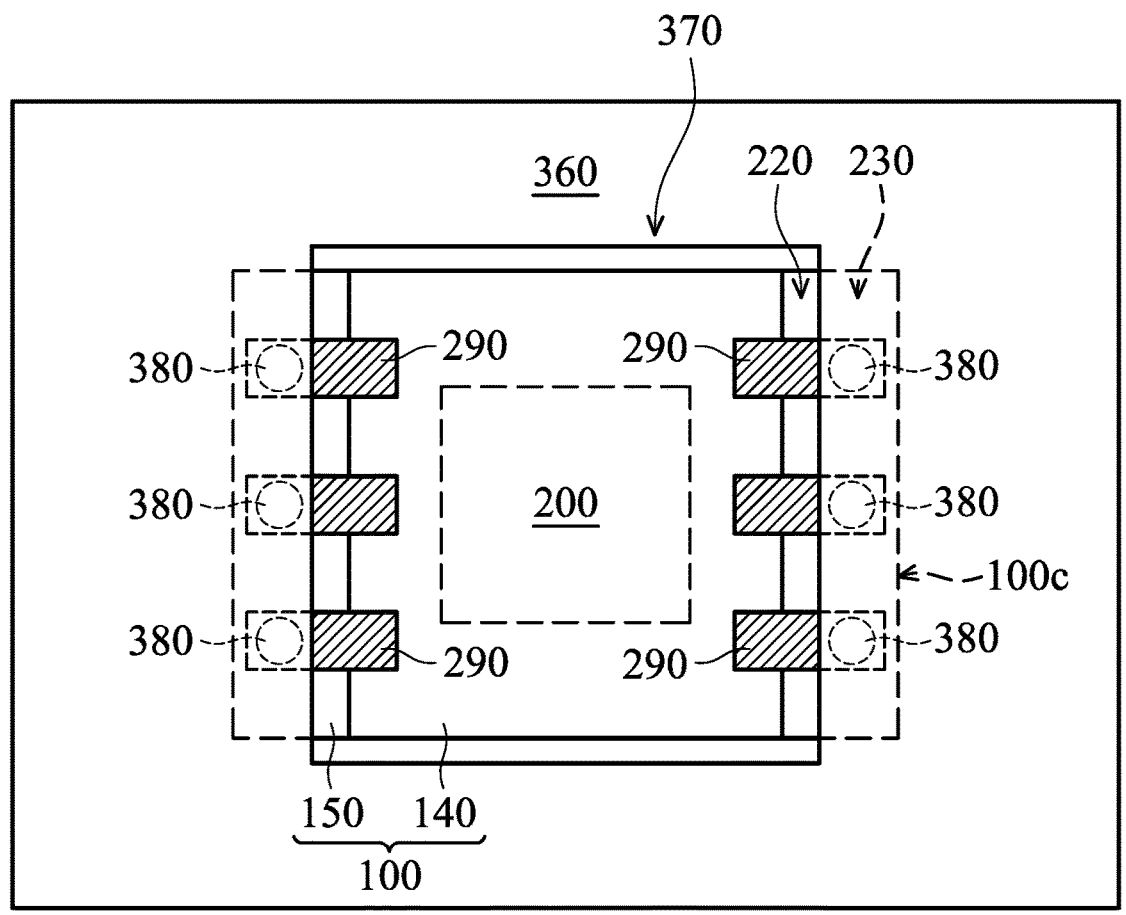

Referring to FIGS. 1H and 3, a cross-sectional view and a top view of an exemplary embodiment of a chip module according to the invention are illustrated. In the embodiment, the chip module comprises a chip 100, a recess 240, a redistribution layer 280, a circuit board 360, and conducting structures 380. To simplify the diagram, only a portion of the chip module is depicted herein.

The chip 100 has an upper surface 100a and a lower surface 100b. In some embodiments, the chip 100 comprises an insulating layer 140 adjacent to the upper surface 100a and an underlying substrate 150 adjacent to the lower surface 100b. In general, the insulating layer 140 may be made of an interlayer dielectric (ILD) layer, inter-metal dielectric (IMD) layers and a covering passivation layer. To simplify the diagram, the insulating layer 140 is depicted with only one layer. In some embodiments, the insulating layer 140 may comprise an inorganic material, such as silicon oxide, silicon nitride, silicon oxynitride, metal oxide, a combination thereof, or another suitable insulating material. In some embodiments, the substrate 150 may comprise silicon or another semiconductor material.

In some embodiments, the chip 100 comprises a signal pad region 160 and a sensing region or device region 200 adjacent to the upper surface 100a. In some embodiments, the signal pad region 160 comprises one or more conducting pads which may be a single conducting layer or comprise multiple conducting layers. To simplify the diagram, only one conducting pad comprising a single conducting layer in the insulating layer 140 is depicted herein as an example. In some embodiments, the insulating layer 140 comprises one or more openings exposing the corresponding conducting pads.

In some embodiments, the chip 100 of the sensing region or device region 200 may comprise a sensing or electrical element and necessary integrated circuits. For example, the integrated circuits may comprise a complementary metal oxide semiconductor (CMOS) transistor, a resistor, a capacitor, another active or passive element. The sensing element in the chip 100 may be electrically connected to the signal pad region 160 through interconnection structures (not shown) in the insulating layer 140. The interconnection structures may comprise contacts, metal wiring layers and vias. In some embodiments, the sensing element in the chip 100 may be configured to sense biometrics and the chip 100 is a biometrics-sensing chip. For example, the chip 100 comprises a fingerprint-recognition element, and the chip 100 is a fingerprint-recognition chip. In some other embodiments, the chip 100 may comprise a sensing element which is configured to sense environmental characteristics (such as a temperature-sensing element, a humidity-sensing element, a pressure-sensing element, a capacitance-sensing element, or another suitable sensing element). Alternatively, the chip 100 may comprise an image-sensing element (such as a photodiode, a phototransistor, or another light-sensing element).

A first recess 220 is positioned in the chip 100 outside of the signal pad region 160 and the sensing region or device region 200. The first recess 220 extends from the upper surface 100a towards the lower surface 100b along a sidewall 100c of the chip 100 so as to expose the underlying substrate 150. In some embodiments, the first recess 220 laterally extends across the entire length or width of one side edge of the chip 100. As a result, an upper portion of the side edge of the chip 100 retracts towards the interior of the upper surface 100a. In some other embodiments, the first recess 220 continuously extends across the entire length or width of multiple (two, three or four) side edges of the chip 100.

The first recess 220 has a sidewall 220a and a bottom 220b. In some embodiments, the sidewall 220a of the first recess 220 is an edge of the insulating layer 140. Moreover, the bottom 220b may be located at or lower than an interface between the insulating layer 140 and the substrate 150. In other words, the bottom 220b may be optionally positioned at the interface between the insulating layer 140 and the substrate 150 or may be positioned between the interface and the lower surface 100b. As a result, the upper surface or the interior of the substrate 150 is exposed. In some embodiments, the sidewall 220a may be substantially perpendicular to the upper surface 100a. In some other embodiments, the sidewall 220a may be inclined to the upper surface 100a. In addition, the bottom 220b may be parallel or inclined to the upper surface 100a. It should be realized that the profile of the first recess 220 may have other shapes and it is not limited thereto.

One or more than one second recess 230 is positioned in the chip 100 outside of the signal pad region 160 and the sensing region or device region 200. The second recess 230 extends from the bottom 220b of the first recess 220 towards the lower surface 100b along the sidewall 100c. As a result, the first recess 220 and the second recess 230 together form a recess 240. In some embodiments, the second recess 230 laterally extends across the entire length or width of one side edge of the chip 100. In some other embodiments, the second recess 230 continuously extends across the entire length or width of multiple (two, three or four) side edges of the chip 100.

The second recess 230 has a sidewall 230a and a bottom 230b. In some embodiments, the sidewall 230a may be substantially perpendicular to the upper surface 100a. In some other embodiments, the sidewall 220a may be inclined to the upper surface 100a. In addition, the bottom 230b may be parallel or inclined to the upper surface 100a. It should be realized that the profile of the second recess 230 may have other shapes and it is not limited thereto. In some embodiments, the depth D1 of the first recess 220 is less than the depth D2 of the second recess 230, and the width of the bottom 220b is less than the width of the bottom 230b.

An insulating layer 260 is disposed on the upper surface 100a of the chip 100, and conformally extends to the sidewall 230a and the bottom 230b of the second recess 230 through the first recess 220. Moreover, the insulating layer 260 has one or more openings exposing a portion of the signal pad region 160. In some embodiments, the insulating layer 260 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), a high-k dielectric material or another suitable insulating material.

The patterned redistribution layer 280 is disposed on the insulating layer 260. The redistribution layer 280 conformally extends in the recess 240 and extends to the sidewall 230a and the bottom 230b. In some embodiments, the redistribution layer 280 electrically contacts the exposed signal pad region 160. In some embodiments, the redistribution layer 280 does not extend to the edge of the bottom 230b. Namely, the redistribution layer 280 retracts from the sidewall 100c of the chip 100. In some embodiments, the redistribution layer 280 may comprise aluminum, copper, gold, platinum, nickel, tin, a combination thereof, a conductive polymer material, a conductive ceramic material (such as indium tin oxide or indium zinc oxide), or another suitable conductive material.

A metal layer 290 is disposed on the redistribution layer 280. The metal layer 290 extends along the redistribution layer 280 to the sidewall 230a and the bottom 230b through the first recess 220. In some embodiments, the metal layer 290 completely vertically overlaps the redistribution layer 280. As a result, the metal layer 290 and the redistribution layer 280 have the same profile as viewed from a top perspective. In some embodiments, the metal layer 290 may comprise gold, nickel, a combination thereof, or another suitable solderable material.

A circuit board 360, such as a flexible printed circuit board (FPCB), has an opening 370. In some embodiments, the circuit board 360 may comprise a polyimide base having a thickness equal to or greater than 50 μm, such as 62 μm. In some other embodiments, the circuit board 360 may comprise an FR4 base having a thickness equal to or greater than 100 μm.

Multiple conducting structures 380 are disposed on the circuit board 360 and are arranged along edges of the opening 370. In some embodiments, the conducting structures 380 may be solder balls. In some other embodiments, the conducting structures 380 may be conductive pillars (such as a conductive pillar formed of a metal pillar and a solder layer) or another suitable conducting structure. In some embodiments, the conducting structures 380 may comprise tin, lead, copper, gold, nickel, a combination thereof, or another suitable solderable material.

In accordance with some embodiments, the chip 100 is embedded in the circuit board 360. The chip 100 is bonded to the circuit board 360 through the conducting structures 380. As a result, the opening 370 surrounds a portion of the chip 100. For example, the opening 370 at least surrounds the insulating layer 140. The circuit board 360 is positioned between the upper surface 100a of the chip 100 and the lower surface 100b of the chip 100, and extends into the recess 240. Each of the conducting structures 380 adjacent to the edges of the opening 370 is sandwiched between the circuit board 360 and the chip 100, and is positioned in the recess 240. In some embodiments, the conducting structures 380 directly electrically contact the metal layer 290 in the recess 240. As a result, the signal pad region 160 is electrically connected to the circuit board 360 through the metal layer 290 and the redistribution layer 280. In some embodiments, as long as the chip 100 can be embedded in the circuit board 360 and the circuit board 360 can extend into the recess 240, the size and shape of the chip 100 and the opening 370 are not limited.

In some embodiments, the circuit board 360 is positioned between the bottom 220b of the first recess 220 and the lower surface 100b of the chip 100. In other words, the circuit board 360 is positioned between the bottom 220b of the first recess 220 and the bottom 230b of the second recess 230. In some other embodiments, as long as the circuit board 360 is positioned between the upper surface 100a and the lower surface 100b, the circuit board 360 can have an alternative arrangement and it is not limited thereto. For example, the circuit board 360 may be positioned between the bottom 220b of the first recess 220 and the upper surface 100a of the chip 100.

As shown in FIG. 3, in some embodiments, the circuit board 360 vertically overlaps two opposite side portions of the chip 100 as viewed from a top perspective. As a result, the opening 370 of the circuit board 360 exposes the partial chip 100, rather than the entire chip 100. For example, the opening 370 exposes the entire sensing region or device region 200, the partial recess 240, and the partial metal layer 290. In some other embodiments, as long as the circuit board 360 vertically overlaps at least one side portion of the chip 100 with a recess, the circuit board 360 can have an alternative arrangement and it is not limited thereto. For example, the circuit board 360 may vertically overlap two adjoining side portions of the chip 100. Alternatively, the circuit board 360 may vertically overlap any three side portions of the chip 100 or all four side portions of the chip 100. The actual arrangement between the circuit board 360 and the chip 100 is determined by design requirements and is not limited thereto.

A protection substrate 400 is disposed on the upper surface 100a of the chip 100 to cover a portion of the recess 240 and the circuit board 360. In some embodiments, disposing the protection substrate 400 on the chip 100 provides an abrasion-resistant, scrape-proof and high-reliability surface. As a result, the sensing element in the chip module can be prevented from being contaminated or damaged when the sensing functions of the chip module are being executed. In other embodiments, the protection substrate 400 is optional according to design requirements. In some embodiments, the protection substrate 400 may comprise glass, sapphire, a dielectric substrate, or another suitable protection material. In some embodiments, the protection substrate 400 and the chip 100 are the same size. In some other embodiments, the protection substrate 400 and the chip 100 are different sizes. The size of the protection substrate 400 may be greater than that of the chip 100. For example, the protection substrate 400 extends beyond the sidewall 100c of the chip 100, and covers the circuit board 360 outside of the chip 100.

An encapsulating layer 420 fills the recess 240, and wraps the conducting structures 380, the metal layer 290 and the redistribution layer 280 in the recess 240. In some embodiments, the encapsulating layer 420 at least completely fills the recess 240. For example, the encapsulating layer 420 completely fills a space between the protection substrate 400 and the chip 100. In some embodiments, the encapsulating layer 420 does not extend to the sensing region or device region 200.

Figure 4:
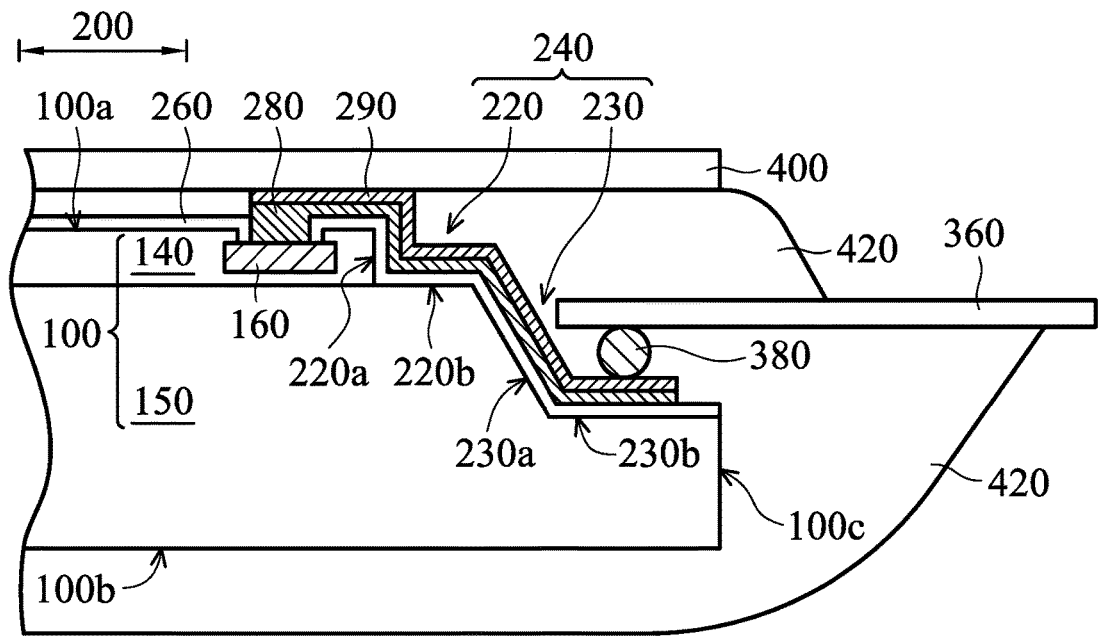
FIGS. 4 and 5 are cross-sectional views of various exemplary embodiments of a chip module according to the invention.
Figure 5:
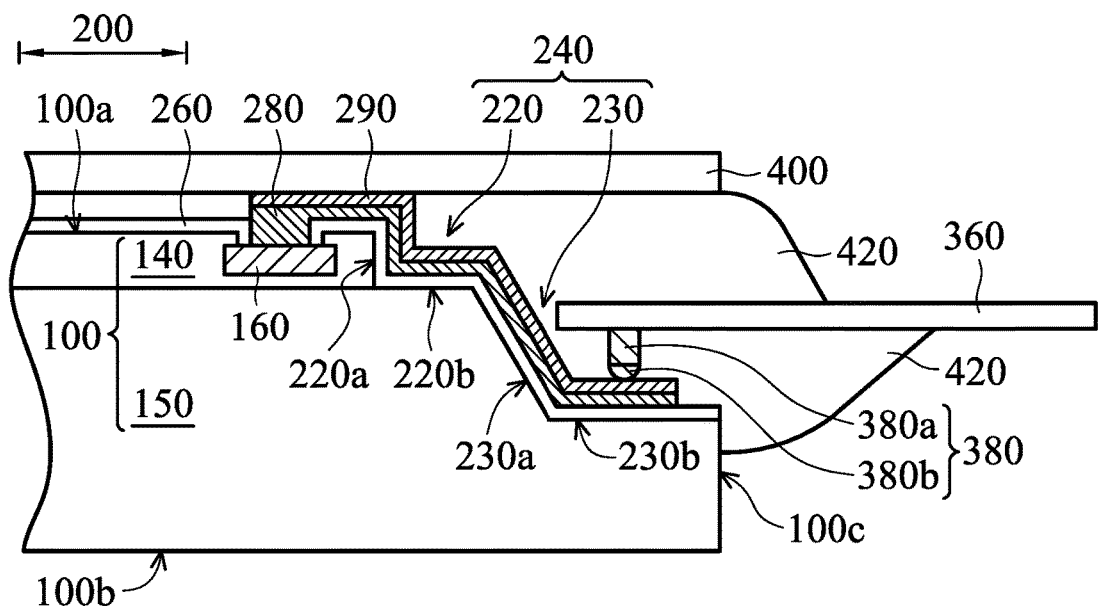
Figure 6A:
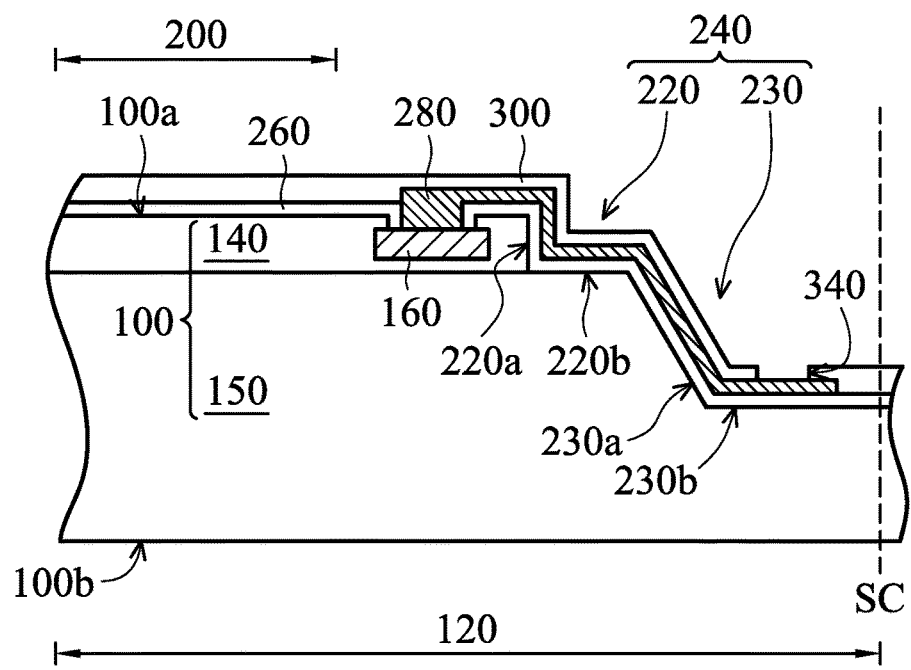
FIGS. 6A to 6C are cross-sectional views of another exemplary embodiment of a method for forming a chip module according to the invention.
Figure 6B:
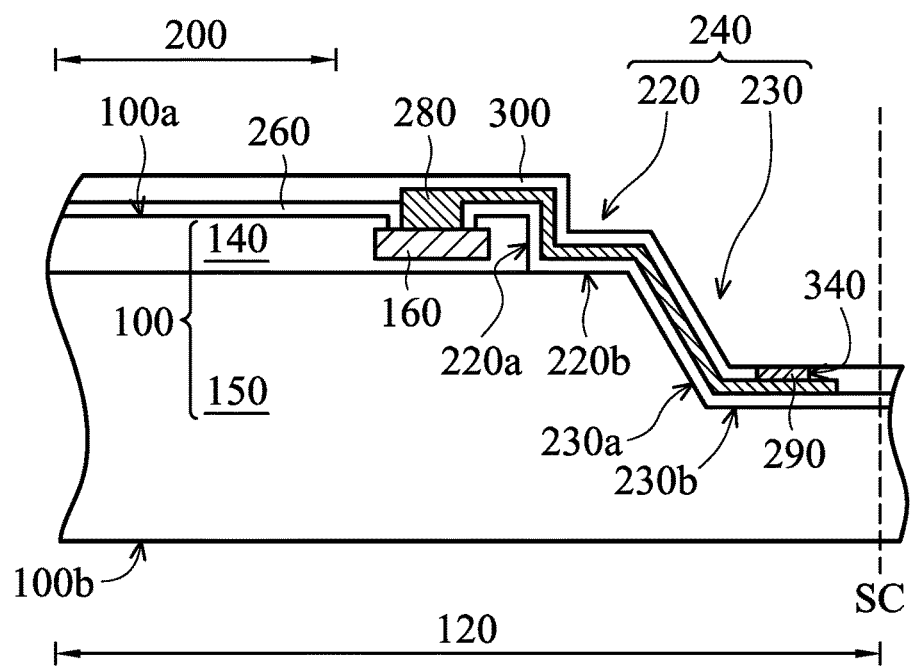
Figure 6C:
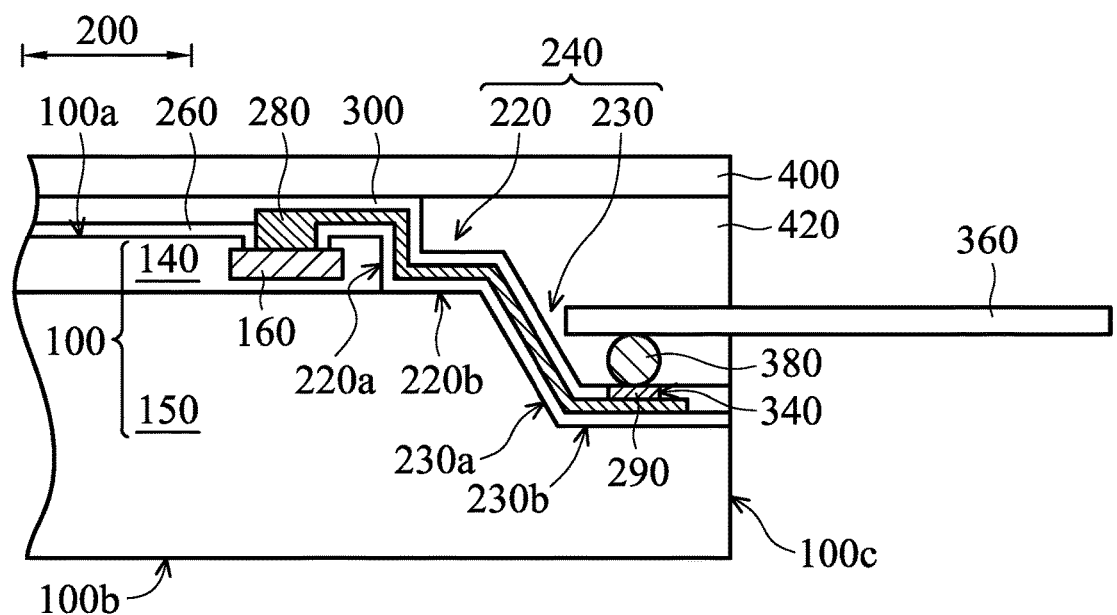

Referring to FIGS. 4, 5 and 6C, cross-sectional views of various exemplary embodiments of a chip module according to the invention are illustrated. Elements in FIGS. 4, 5, and 6C that are the same as those in FIGS. 1H and 3 are labeled with the same reference numbers as in FIGS. 1H and 3, and are not described again for brevity. The structure of the chip module shown in FIG. 4 is similar to that of the chip module shown in FIG. 1H. The differences therebetween comprise that the encapsulating layer 420 shown in FIG. 1H is aligned to the sidewall 100c of the chip 100 without protruding from it while the encapsulating layer 420 shown in FIG. 4 protrudes from the protection substrate 400 and the sidewall 100c of the chip 100. The encapsulating layer 420 shown in FIG. 4 further extends from the recess 240 to the sidewall 100c and the lower surface 100b of the chip 100. In some embodiments, the encapsulating layer 420 may optionally completely encircle the lower surface 100b of the chip 100.

The structure of the chip module shown in FIG. 5 is similar to that of the chip module shown in FIG. 1H. One of the differences therebetween is that the encapsulating layer 420 shown in FIG. 5 protrudes from the protection substrate 400 and the sidewall 100c of the chip 100. The encapsulating layer 420 shown in FIG. 5 further extends from the recess 240 to the sidewall 100c of the chip 100 without extending to the lower surface 100b of the chip 100. In some other embodiments, the encapsulating layer 420 may extend from the recess 240 to the sidewall of the protection substrate 400. It should be realized that the shape or profile of the encapsulating layer 420 shown in FIGS. 4 and 5 are depicted herein as an example. The actual shape or profile of the encapsulating layer 420 is determined by design requirements and is not limited thereto.

Moreover, the structure differences between the chip modules shown in FIG. 1H and FIG. 5 also comprise that one of the conducting structures 380 shown in FIG. 1H is a solder ball while one of the conducting structures 380 shown in FIG. 5 is a conductive pillar. For example, the conductive pillar is formed of an underlying metal pillar 380a and an overlying solder layer 380b. In some embodiments, the underlying metal pillar 380a (such as a copper pillar) adjoins the circuit board 360 and the overlying solder layer 380b adjoins the metal layer 290.

The structure of the chip module shown in FIG. 6C is similar to that of the chip module shown in FIG. 1H. One of the differences therebetween is that the chip module shown in FIG. 6C comprises a protection layer 300. The protection layer 300 is disposed on the insulating layer 260, covers the redistribution layer 280, and extends into the recess 240. As a result, a first portion of the protection layer 300 is positioned between the insulating layer 260 and the protection substrate 400. A second portion of the protection layer 300 is positioned between the redistribution layer 280 and the protection substrate 400. A third portion of the protection layer 300 is positioned between the redistribution layer 280 and the encapsulating layer 420. In some embodiments, the protection layer 300 has an opening 340 in the recess 240 and exposing a portion of the redistribution layer 280. Moreover, the metal layer 290 is sandwiched between one of the conducting structures 380 and the redistribution layer 280, and is located only in the opening 340 of the protection layer 300 without extending along the redistribution layer 280 (as shown in FIG. 1H).

In accordance with some embodiments of the invention, the chip 100 is embedded in the opening 370 of the circuit board 360. The circuit board 360 is positioned between the upper surface 100a of the chip 100 and the lower surface 100b of the chip 100, and extends into the recess 240. One of the conducting structures 380 is sandwiched between the circuit board 360 and the chip 100. Since the conducting structures 380 are located only inside the recess 240 without protruding from the upper surface 100a of the chip 100, the encapsulating layer 420 merely needs to form in the recess 240. As a result, the thickness of the layer(s) on the sensing region or device region 200 is greatly reduced. Therefore, the sensitivity of the chip module is improved and the height of the chip module is lowered. A chip module with a flat contacting surface can be provided.

Figure 2:
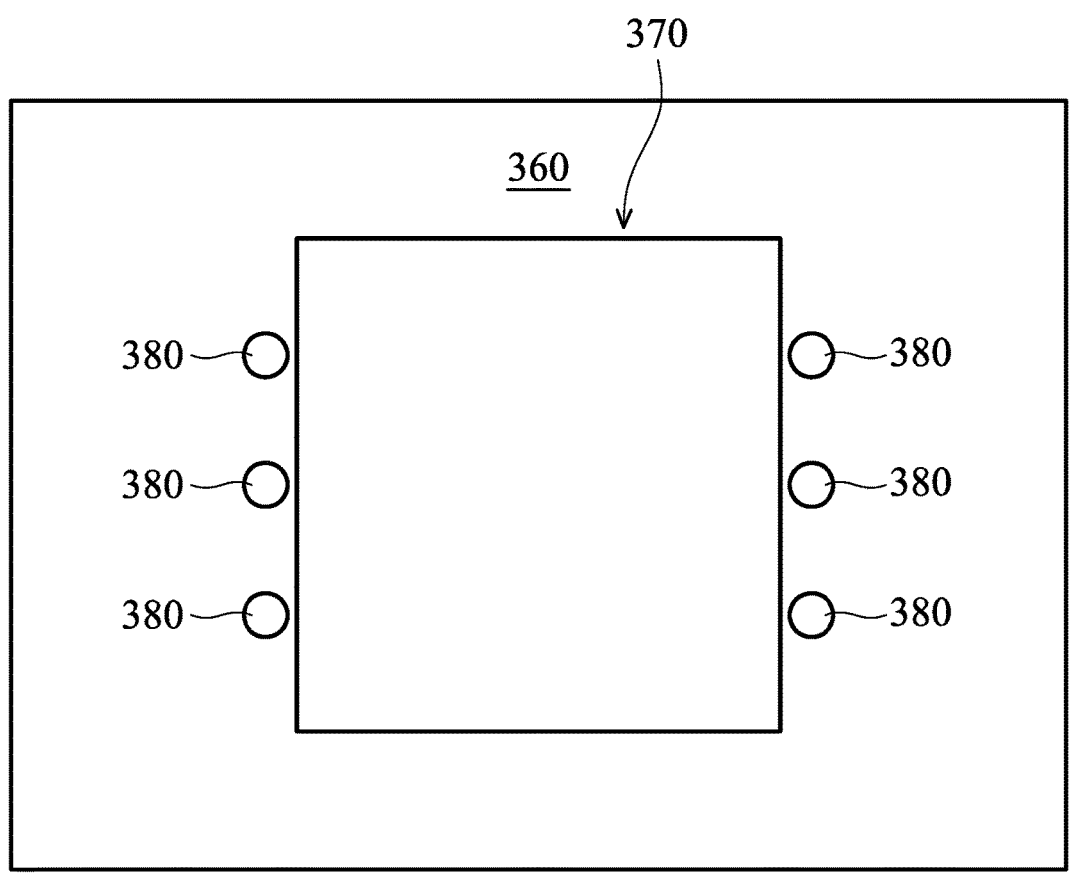
FIGS. 2 and 3 are top views of an exemplary embodiment of a chip module according to the invention.

An exemplary embodiment of a method for forming a chip module according to the invention is illustrated in FIGS. 1A to 1H and FIGS. 2 and 3. FIGS. 1A to 1H are cross-sectional views of an exemplary embodiment of a method for forming a chip module according to the invention. FIGS. 2 and 3 are top views of an exemplary embodiment of a chip module according to the invention.

Referring to FIG. 1A, a wafer with multiple chip regions 120 is provided. The chip regions 120 define multiple chips 100 and a scribed line SC is defined between the chip regions 120. To simplify the diagram, only a portion of one chip region 120 is depicted herein. The chip 100 has an upper surface 100a and a lower surface 100b. In some embodiments, the chip 100 comprises an insulating layer 140 adjacent to the upper surface 100a and an underlying substrate 150 adjacent to the lower surface 100b. In general, the insulating layer 140 may be made of an ILD layer, IMD layers and a covering passivation layer. In some embodiments, the insulating layer 140 may comprise an inorganic material, such as silicon oxide, silicon nitride, silicon oxynitride, metal oxide, a combination thereof, or another suitable insulating material. In some embodiments, the substrate 150 may comprise silicon or another semiconductor material.

In some embodiments, the chip 100 in each chip region 120 comprises a signal pad region 160 and a sensing region or device region 200 adjacent to the upper surface 100a. In some embodiments, the signal pad region 160 comprises one or more conducting pads which may be a single conducting layer or comprise multiple conducting layers. To simplify the diagram, only one conducting pad comprising a single conducting layer in the insulating layer 140 is depicted herein as an example. In some embodiments, the insulating layer 140 comprises one or more openings exposing the corresponding conducting pads.

In some embodiments, the chip 100 of the sensing region or device region 200 may comprise a sensing or electrical element and necessary integrated circuits. For example, the integrated circuits may comprise a CMOS transistor, a resistor, a capacitor, another active or passive element. The sensing element in the chip 100 may be electrically connected to the signal pad region 160 through interconnection structures (not shown) in the insulating layer 140. The interconnection structures may comprise contacts, metal wiring layers and vias. In some embodiments, the sensing element in the chip 100 may be configured to sense biometrics. For example, the chip 100 comprises a fingerprint-recognition element. In some other embodiments, the chip 100 may comprise a sensing element which is configured to sense environmental characteristics (such as a temperature-sensing element, a humidity-sensing element, a pressure-sensing element, a capacitance-sensing element, or another suitable sensing element). Alternatively, the chip 100 may comprise an image-sensing element (such as a photodiode, a phototransistor, or another light-sensing element).

In the embodiment, the substrate 150 comprising integrated circuits may be fabricated by performing a front-end process of a semiconductor device. Afterwards, the insulating layer 140 and the interconnection structures in the insulating layer 140 may be formed on the substrate 150 by performing a back-end process of a semiconductor device. It should be realized that various exemplary embodiments of a method for forming a chip module according to the invention proceeds subsequently packaging processes to the wafer or the chip 100 after the back-end process is finished.

Referring to FIG. 1B, a first recess 220 may be formed in the chip 100 in each chip region 120 by a lithography process and an etching process (such as a dry etching process, a wet etching process, a plasma etching process, a reactive ion etching process, or another suitable process) or a dicing process. The first recess 220 in each chip region 120 is formed outside of the signal pad region 160 and the sensing region or device region 200. The first recess 220 extends from the upper surface 100a towards the lower surface 100b along the scribed line SC between the chip regions 120 so as to expose the underlying substrate 150.

The first recess 220 has a sidewall 220a and a bottom 220b. In some embodiments, the sidewall 220a of the first recess 220 is an edge of the insulating layer 140. Moreover, the bottom 220b may be located at or lower than an interface between the insulating layer 140 and the substrate 150. In other words, the bottom 220b may be optionally positioned at the interface between the insulating layer 140 and the substrate 150 or may be positioned between the interface and the lower surface 100b. As a result, the upper surface or the interior of the substrate 150 is exposed.

Referring to FIG. 1C, one or more than one second recess 230 may be formed in the chip 100 in each chip region 120 by a lithography process and an etching process (such as a dry etching process, a wet etching process, a plasma etching process, a reactive ion etching process, or another suitable process) or a dicing process. The second recess 230 in each chip region 120 extends from the bottom 220b of the first recess 220 towards the lower surface 100b along the scribed line SC between the chip regions 120. As a result, the first recess 220 and the second recess 230 together form a recess 240. The second recess 230 has a sidewall 230a and a bottom 230b. In some embodiments, the depth D1 of the first recess 220 is less than the depth D2 of the second recess 230, and the width of the bottom 220b is less than the width of the bottom 230b.

In accordance with some embodiments, continuously forming the first recess 220 and the second recess 230 in the chip 100, rather than forming only one recess and directly extending it downward which removes too much substrate material, can make the chip 100 have sufficient structural strength. Undercutting at an interface between the insulating layer 140 and the substrate 150 can be prevented.

Referring to FIG. 1D, an insulating layer 260 may be conformally formed on the upper surface 100a of the chip 100 by a deposition process (such as a coating process, a physical vapor deposition process, a chemical vapor deposition process or another suitable process). The insulating layer 260 extends to the sidewall 230a and the bottom 230b of the second recess 230 through the first recess 220. In some embodiments, the insulating layer 260 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a high-k dielectric material or another suitable insulating material.

Afterwards, a portion of the insulating layer 260 on the signal pad region 160 is removed by a lithography process and an etching process (such as a dry etching process, a wet etching process, a plasma etching process, a reactive ion etching process, or another suitable process) so as to expose a portion of the signal pad region 160.

Next, a patterned redistribution layer 280 may be formed on the insulating layer 260 by a deposition process (such as a coating process, a physical vapor deposition process, a chemical vapor deposition process, an electroplating process, an electroless plating process or another suitable process) and lithography and etching processes. The redistribution layer 280 extends from the upper surface 100a of the chip 100 to the sidewall 230a and the bottom 230b. The redistribution layer 280 is electrically connected to the exposed signal pad region 160. In some embodiments, the redistribution layer 280 retracts from the sidewall 100c of the chip 100. As a result, the redistribution layer 280 can be prevented from being cut during a subsequent dicing process so as to avoid warpage of the redistribution layer 280 in the recess 240. Therefore, the reliability of the chip module is enhanced. In some embodiments, the substrate 150 comprises a semiconductor material, and the redistribution layer 280 is electrically isolated from the semiconductor material by the insulating layer 260. In some embodiments, the redistribution layer 280 may comprise aluminum, copper, gold, platinum, nickel, tin, a combination thereof, a conductive polymer material, a conductive ceramic material (such as indium tin oxide or indium zinc oxide), or another suitable conductive material.

Referring to FIG. 1E, a metal layer 290 may be conformally formed on the redistribution layer 280 by a deposition process (such as an electroplating process, an electroless plating process or another suitable process). The metal layer 290 extends along the redistribution layer 280 to the sidewall 230a and the bottom 230b through the first recess 220. In some embodiments, the metal layer 290 may comprise gold, nickel, a combination thereof, or another suitable solderable material.

Afterwards, a dicing process is performed on the wafer along the scribed line SC between the chip regions 120 so as to form multiple separated chips 100. After the dicing process, the recess 240 of each chip 100 extends from the upper surface 100a towards the lower surface 100b along the sidewall 100c of the chip 100.

Referring to FIG. 2, a circuit board 360 (such as a FPCB) is provided. The circuit board 360 has an opening 370. In some embodiments, the circuit board 360 may comprise a polyimide base having a thickness equal to or greater than 50 μm, such as 62 μm. In some other embodiments, the circuit board 360 may comprise an FR4 base having a thickness equal to or greater than 100 μm.

Afterwards, multiple conducting structures 380 are formed on the circuit board 360. The conducting structures 380 are arranged along edges of the opening 370. Three conducting structures 380 arranged on each of two opposite sides of the opening 370 are depicted herein as an example. It should be realized that the actual number and arranged position of the conducting structures 380 are determined by design requirements and are not limited thereto.

In some embodiments, the conducting structures 380 may be solder balls. Multiple conducting structures 380 may be simultaneously formed on the circuit board 360 by a screen printing process or another suitable process. In some other embodiments, the conducting structures 380 may be conductive pillars (such as a conductive pillar formed of a metal pillar and a solder layer) or another suitable conducting structure. In some embodiments, the conducting structures 380 may comprise tin, lead, copper, gold, nickel, a combination thereof, or another suitable solderable material.

Referring to FIGS. 1F and 3, the insulating layer 260 shown in FIG. 1F is not shown in FIG. 3 for a better understanding of the structure. After the formation of the independent chip 100, the chip 100 is inset in the circuit board 360 through the opening 370. A reflow process is performed, so that the chip 100 is bonded to the circuit board 360 through the conducting structures 380. In this case, the opening 370 surrounds a portion of the chip 100. For example, the opening 370 at least surrounds the insulating layer 140.

The circuit board 360 is positioned between the upper surface 100a of the chip 100 and the lower surface 100b of the chip 100, and extends into the recess 240. Each of the conducting structures 380 adjacent to the edges of the opening 370 is sandwiched between the circuit board 360 and the chip 100, and is positioned in the recess 240. In some embodiments, a portion of the metal layer 290 in the recess 240 is sandwiched between the conducting structures 380 and the redistribution layer 280. As a result, the conducting structures 380 directly electrically contact the metal layer 290, and the signal pad region 160 is electrically connected to the circuit board 360 through the metal layer 290 and the redistribution layer 280.

Referring to FIG. 1G, a protection substrate 400 is provided on the upper surface 100a of the chip 100 so as to cover the recess 240 and a portion of the circuit board 360. The protection substrate 400 adjoins the metal layer 290. In some embodiments, disposing the protection substrate 400 on the upper surface 100a of the chip 100 provides an abrasion-resistant, scrape-proof and high-reliability surface. As a result, the sensing element in the chip module can be prevented from being contaminated or damaged when the sensing functions of the chip module are being executed. In other embodiments, the protection substrate 400 is optional according to design requirements. In some embodiments, the protection substrate 400 may comprise glass, sapphire, a dielectric substrate, or another suitable protection material. In some embodiments, the protection substrate 400 and the chip 100 are the same size. In some other embodiments, the protection substrate 400 and the chip 100 are different sizes. The size of the protection substrate 400 may be greater than that of the chip 100.

Referring to FIG. 1H, an encapsulating material is injected or filled into the recess 240 by a molding process, a dispensing process, or another suitable process so as to form an encapsulating layer 420. The encapsulating layer 420 fills the recess 240, and surrounds the conducting structures 380, the metal layer 290 and the redistribution layer 280 in the recess 240. As a result, joints between the circuit board 360 and the chip 100 are fixed, and the fabrication of a chip module is finished.

In one embodiment, the encapsulating layer 420 at least completely fills the recess 240. For example, the encapsulating layer 420 completely fills a space between the protection substrate 400 and the chip 100. In another embodiment, the encapsulating layer 420 further extends to the sidewall 100c of the chip 100 (as shown in FIG. 5) and/or the sidewall of the protection substrate 400. In yet another embodiment, the encapsulating layer 420 further extends to the lower surface 100b of the chip 100 through the sidewall 100c of the chip 100. In other embodiments, the encapsulating layer 420 completely encloses the lower surface 100b of the chip 100 (as shown in FIG. 4) so as to increase the structural strength or hardness of the chip module. It should be realized that the shape or profile of the encapsulating layer 420 shown in FIG. 1H are depicted herein as an example. The actual shape or profile of the encapsulating layer 420 is determined by design requirements and is not limited thereto.

In some embodiments, the circuit board 360 may be a PCB panel (a panelized PCB) or a circuit board depanelized from a PCB panel. When the circuit board 360 is a panelized PCB, the circuit board 360 may be optionally depanelized to multiple PCBs after bonding the circuit board 360 and the chip 100 together, after providing the protection substrate 400, or after the formation of the encapsulating layer 420. As a result, multiple chip modules can be fabricated simultaneously. In some embodiments, the fabricated chip module may be directly mounted in an electronic product. In some other embodiments, before mounting the fabricated chip module in an electronic product, a printed circuit board (not shown) may be optionally bonded to the chip module. The thickness of the printed circuit board is greater than that of the circuit board 360. As a result, the structural strength and hardness of the chip module are improved.

In addition, as shown in FIGS. 1G and 1H, after the formation of the encapsulating layer 420, there is a cavity or gap between the protection substrate 400 and the upper surface 100a of the chip 100 or between the protection substrate 400 and the insulating layer 260. However, in some other embodiments, an insulating material (such as a high-k dielectric material) may be optionally filled between the protection substrate 400 and the insulating layer 260.

Figure 7:
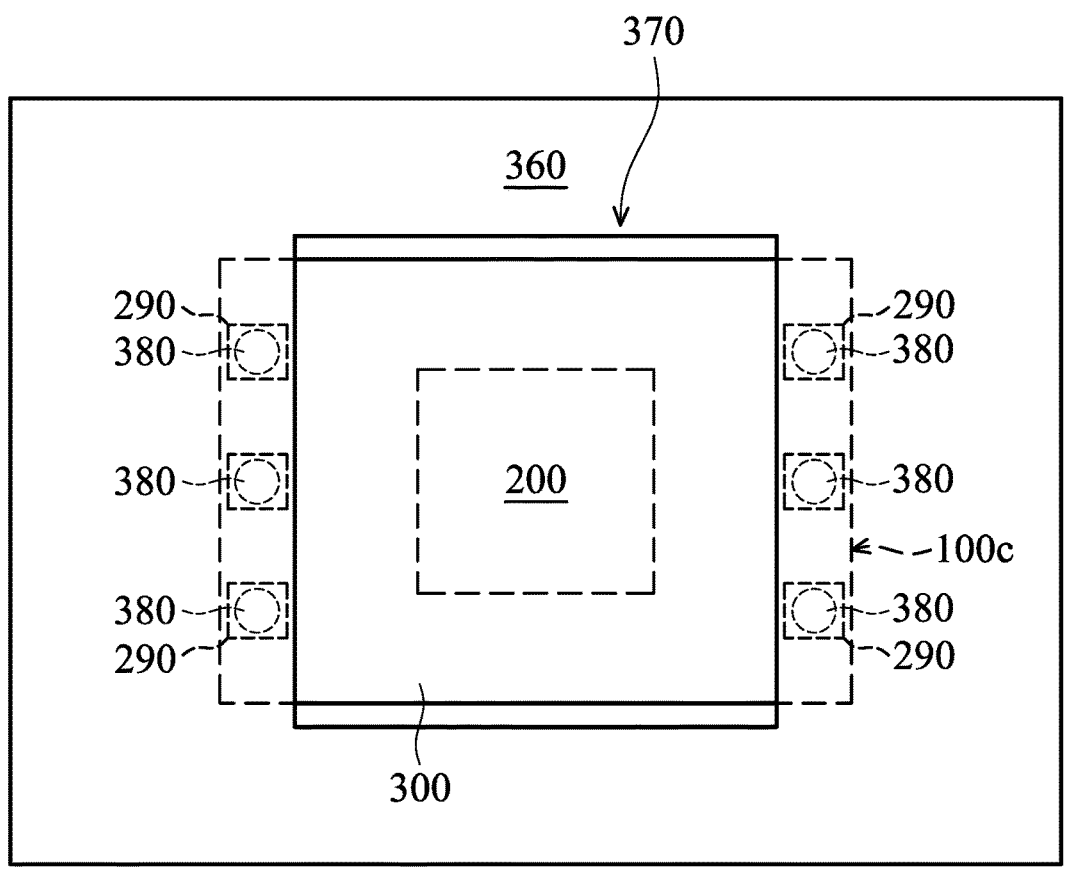
FIG. 7 is a top view of another exemplary embodiment of a chip module according to the invention.

Another exemplary embodiment of a method for forming a chip module according to the invention is illustrated in FIGS. 6A to 6C and FIG. 7. FIGS. 6A to 6C are cross-sectional views of another exemplary embodiment of a method for forming a chip module according to the invention. FIG. 7 is a top view of another exemplary embodiment of a chip module according to the invention. Elements in FIGS. 6A to 6C and FIG. 7 that are the same as those in FIGS. 1A to 1H and FIGS. 2 and 3 are labeled with the same reference numbers as in FIGS. 1A to 1H and FIGS. 2 and 3, and are not described again for brevity.

Referring to FIG. 6A, a recess 240 comprising a first recess 220 and a second recess 230 is formed in the chip 100 in each chip region 120 by processes which may be the same as or similar to those in FIGS. 1A to 1C. Next, an insulating layer 260 and a redistribution layer 280 are formed by processes which may be the same as or similar to those in FIG. 1D.

Afterwards, a protection layer 300 may be conformally formed on the upper surface 100a of the chip 100 by a deposition process (such as a coating process, a physical vapor deposition process, a chemical vapor deposition process or another suitable process). The protection layer 300 covers the redistribution layer 280 and the insulating layer 260, and extends into the first recess 220 and the second recess 230. In some embodiments, the protection layer 300 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a high-k dielectric material or another suitable insulating material.

Subsequently, one or more openings 340 are formed in the protection layer 300 by a lithography process and an etching process (such as a dry etching process, a wet etching process, a plasma etching process, a reactive ion etching process, or another suitable process). As a result, a portion of the redistribution layer 280 in the recess 240 is exposed. It should be realized that the number and position of the openings 340 in the protection layer 300 are determined by design requirements and are not limited thereto.

Referring to FIG. 6B, a metal layer 290 may be formed in the openings 340 of the protection layer 300 by a deposition process (such as an electroplating process, an electroless plating process or another suitable process). Afterwards, a dicing process is performed on the wafer along the scribed line SC between the chip regions 120 so as to form multiple separated chips 100. Subsequently, multiple conducting structures 380 are formed on the circuit board 360 (such as a FPCB) with an opening 370. The conducting structures 380 are arranged along edges of the opening 370, as shown in FIG. 2.

Referring to FIGS. 6C and 7, the protection substrate 400 and the encapsulating layer 420 shown in FIG. 6C is not shown in FIG. 7 for a better understanding of the structure. After the formation of the independent chip 100, the chip 100 is bonded to the circuit board 360 by processes which may be the same as or similar to those in FIG. 1F. The circuit board 360 extends into the recess 240. Each of the conducting structures 380 is sandwiched between the circuit board 360 and the metal layer 290. As a result, the signal pad region 160 is electrically connected to the circuit board 360 through the metal layer 290 and the redistribution layer 280.

Afterwards, a protection substrate 400 is provided on the upper surface 100a of the chip 100 by processes which may be the same as or similar to those in FIGS. 1G and 1H. The protection substrate 400 adjoins the protection layer 300. An encapsulating layer 420 then fills the recess 240 so as to protect the conducting structures 380, the metal layer 290 and the redistribution layer 280 in the recess 240. As shown in FIG. 7, the opening 370 of the circuit board 360 exposes only a portion of the chip 100. For example, the opening 370 exposes only a portion of the protection layer 300. The metal layer 290 in the recess 240 completely vertically overlaps the circuit board 360.

According to the aforementioned embodiments of the invention, the multi-step recess 240 is formed on at least one side of the chip 100. The chip 100 is embedded in the circuit board 360 through the opening 370. The circuit board 360 extends into the recess 240. As a result, the circuit board 360 and the chip 100 can be bonded together directly by the conducting structures 380. The circuit board 360 can also be electrically connected to the metal layer 290 and the redistribution layer 280 in the recess 240 by the conducting structures 380 without wires. Therefore, short circuit or broken circuit issues due to the formation of wires can be prevented. A chip module can also be prevented from having an uneven contacting surface and a reduced sensitivity which are resulted from the height of protruding wires.

In comparison with bonding a chip and a circuit board together and electrically connecting the chip to the circuit board by a wire bonding process, in accordance with some embodiments of the invention, multiple conducting structures 380 can be simultaneously formed on the circuit board 360. The chip 100 is bonded to and electrically connected to the circuit board 360 directly through the conducting structures 380. As a result, the fabricating steps can be simplified, and the cost and the fabricating time can be reduced. Therefore, a more simplified and faster chip module packaging process is provided.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip module, comprising:
   a chip having an upper surface, a lower surface and a sidewall, wherein the chip comprises a signal pad region adjacent to the upper surface;
   a recess extending from the upper surface toward the lower surface along the sidewall of the chip;
   a redistribution layer electrically connected to the signal pad region and extending into the recess;
   a circuit board between the upper surface and the lower surface and extending into the recess; and
   a conducting structure in the recess and electrically connecting the circuit board to the redistribution layer.

2. The chip module as claimed in claim 1, further comprising an encapsulating layer filling the recess and wrapping the conducting structure and the redistribution layer in the recess.

3. The chip module as claimed in claim 2, wherein the encapsulating layer at least completely fills the recess.

4. The chip module as claimed in claim 2, wherein the encapsulating layer extends to the sidewall of the chip or extends to the lower surface through the sidewall of the chip.

5. The chip module as claimed in claim 1, further comprising a protection substrate on the upper surface of the chip and covering the recess and the circuit board.

6. The chip module as claimed in claim 1, wherein the conducting structure is a solder ball or a conductive pillar.

7. The chip module as claimed in claim 1, further comprising a metal layer extending into the recess along the redistribution layer, wherein a portion of the metal layer is sandwiched between the conducting structure and the redistribution layer.

8. The chip module as claimed in claim 1, further comprising:
   a protection layer on the upper surface of the chip and covering the redistribution layer, wherein the protection layer has an opening in the recess; and
   a metal layer in the opening and sandwiched between the conducting structure and the redistribution layer.

9. The chip module as claimed in claim 1, wherein the recess comprises a first recess and a second recess, and the first recess extends from the upper surface towards the lower surface, and the second recess extends from a bottom of the first recess towards the lower surface.

10. The chip module as claimed in claim 9, wherein the chip comprises an insulating layer adjacent to the upper surface and a substrate adjacent to the lower surface, and the bottom of the first recess is located at an interface between the insulating layer and the substrate or is located between the interface and the lower surface.

11. The chip module as claimed in claim 9, wherein the circuit board is between the bottom of the first recess and a bottom of the second recess.

12. The chip module as claimed in claim 1, wherein the circuit board comprises an opening, and the chip is embedded in the circuit board through the opening and is surrounded by the opening.

13. A method for forming a chip module, comprising:
   providing a chip having an upper surface, a lower surface and a sidewall, wherein the chip comprises a signal pad region adjacent to the upper surface, and wherein a recess extends from the upper surface toward the lower surface along the sidewall, and a redistribution layer is electrically connected to the signal pad region and extends into the recess;
   disposing a circuit board between the upper surface and the lower surface, wherein the circuit board extends into the recess; and
   forming a conducting structure in the recess to electrically connect the circuit board to the redistribution layer.

14. The method as claimed in claim 13, further comprising filling the recess with an encapsulating layer, wherein the encapsulating layer wraps the conducting structure and the redistribution layer in the recess.

15. The method as claimed in claim 14, wherein the encapsulating layer at least completely fills the recess.

16. The method as claimed in claim 14, wherein the encapsulating layer extends to the sidewall of the chip or extends to the lower surface through the sidewall of the chip.

17. The method as claimed in claim 13, further comprising forming a protection substrate on the upper surface of the chip to cover the recess and the circuit board.

18. The method as claimed in claim 13, wherein the conducting structure is a solder ball or a conductive pillar.

19. The method as claimed in claim 13, further comprising forming a metal layer extending into the recess along the redistribution layer, wherein a portion of the metal layer is sandwiched between the conducting structure and the redistribution layer.

20. The method as claimed in claim 13, further comprising:
 forming a protection layer on the upper surface of the chip to cover the redistribution layer, wherein the protection layer has an opening in the recess; and
 forming a metal layer in the opening, wherein the metal layer is sandwiched between the conducting structure and the redistribution layer.

21. The method as claimed in claim 13, wherein the recess comprises a first recess and a second recess, and the first recess extends from the upper surface towards the lower surface, and the second recess extends from a bottom of the first recess towards the lower surface.

22. The method as claimed in claim 21, wherein the chip comprises an insulating layer adjacent to the upper surface and a substrate adjacent to the lower insulating layer and the substrate or is located between the interface and the lower surface.

23. The method as claimed in claim 21, wherein the circuit board is between the bottom of the first recess and a bottom of the second recess.

24. The method as claimed in claim 13, wherein the circuit board comprises an opening, and the chip is embedded in the circuit board through the opening and is surrounded by the opening.

\* \* \* \* \*